(12) United States Patent
Song et al.

(10) Patent No.: US 7,514,284 B2
(45) Date of Patent: Apr. 7, 2009

(54) IMAGE SENSOR AND METHOD OF FABRICATING THE SAME

(75) Inventors: Jae-Ho Song, Yongin-shi (KR);
Young-Hoon Park, Suwon-shi (KR);
Sang-Hak Shin, Uiwang-shi (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 516 days.

(21) Appl. No.: 11/223,707

(22) Filed: Sep. 9, 2005

(65) Prior Publication Data

US 2006/0006428 A1 Jan. 12, 2006

Related U.S. Application Data

(62) Division of application No. 10/464,340, filed on Jun. 18, 2003.

(30) Foreign Application Priority Data

Jun. 20, 2002 (KR) ............................ 2002-34589
Apr. 21, 2003 (KR) ............................ 2003-25165

(51) Int. Cl.
*H01L 21/00* (2006.01)

(52) U.S. Cl. .......................... 438/48; 438/69; 438/200; 257/290

(58) Field of Classification Search .................. 438/48, 438/69, 200, 592; 257/290–293
See application file for complete search history.

(56) References Cited

U.S. PATENT DOCUMENTS 6,040,593 A * 3/2000 Park ............................. 257/292
6,166,405 A * 12/2000 Kuriyama et al. ............ 257/290
6,737,291 B1 * 5/2004 Lim .............................. 438/45

FOREIGN PATENT DOCUMENTS

EP 1139428 A2 10/2001

\* cited by examiner

*Primary Examiner*—Thinh T Nguyen
(74) *Attorney, Agent, or Firm*—F. Chau & Associates, LLC

(57) ABSTRACT

Image sensors and methods of fabricating the same are provided. The image sensor includes a blocking pattern disposed on photodiodes. The blocking pattern is formed of insulation material having a metal diffusion coefficient which is lower than a silicon oxide diffusion coefficient. Therefore, dark defects of the image sensor are reduced. In addition, the image sensor includes a color-ratio control layer. The color ratio control layer controls color ratios between the sensitivities to blue, green and red. As a result, color distinction of the picture that is embodied by the image sensor can be improved.

6 Claims, 11 Drawing Sheets

Fig. 2
(PRIOR ART)
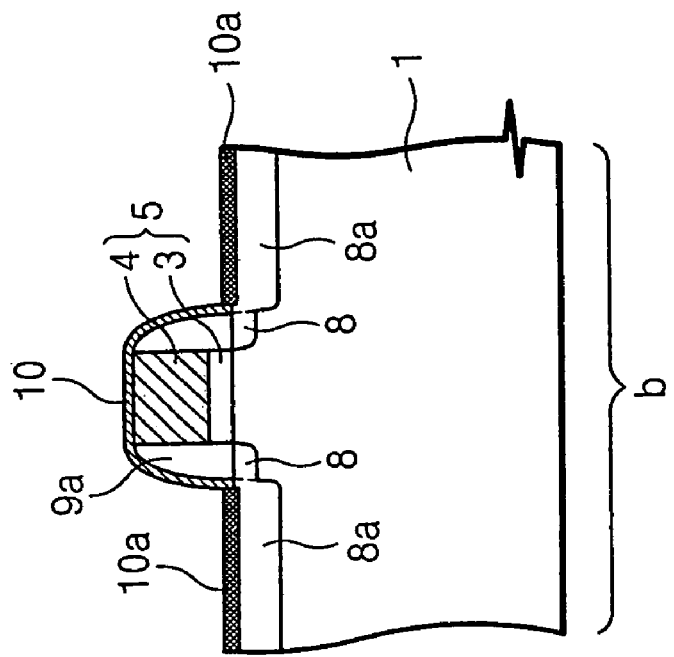
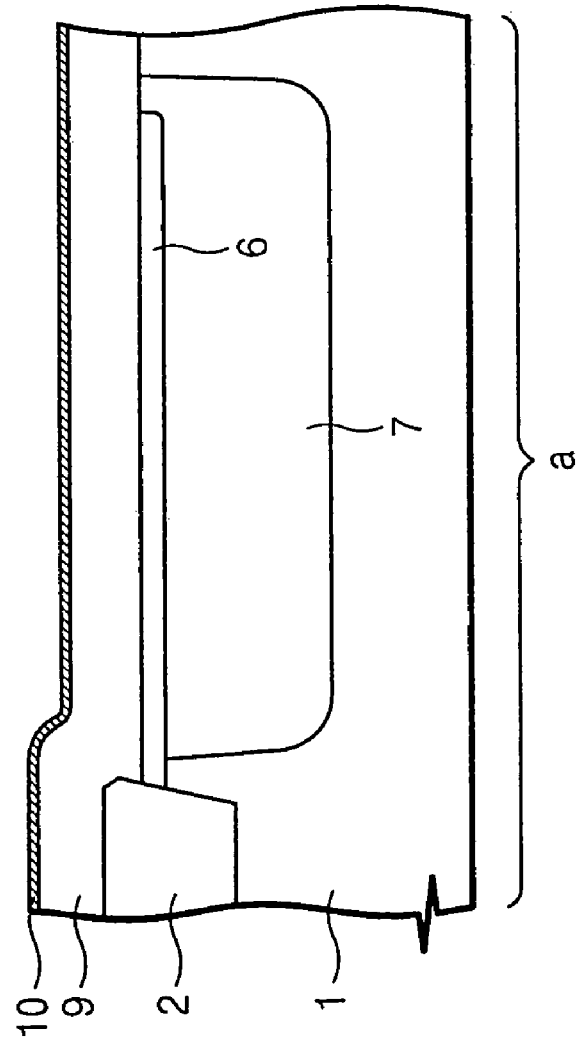

IMAGE SENSOR AND METHOD OF FABRICATING THE SAME

CROSS-REFERENCE TO RELATED APPLICATION

This application is a Divisional of U.S. application Ser. No. 10/464,340 filed on Jun. 18, 2003, the disclosure of which in its entirety is incorporated herein by reference.

FIELD OF THE INVENTION

The present invention relates to a semiconductor device and a method of fabricating the same and more specifically to a CMOS image sensor and a method of fabricating the same.

BACKGROUND OF THE INVENTION

Image sensors play a role in transforming optical images to electrical signals. The image sensors are classified into two major categories, including a complementary metal-oxide-silicon (CMOS) image sensor and a charge coupled device (CCD) image sensor. The CCD image sensor has sensitivity and noise characteristics that are superior to the CMOS image sensor, but has disadvantages which include difficulty of high integration and high power dissipation. The CMOS image sensor has advantages which include simple fabrication, suitability for high integration and low power dissipation.

Recently, there have been improvements in fabrication of CMOS devices and the characteristics thereof. Moreover, extensive studies on the CMOS image sensor have been performed.

Conventionally, a pixel of the CMOS image sensor comprises a photodiode for receiving light and CMOS devices that control the image signals received from the photodiode.

FIG. 1 is a diagram illustrating a circuit of a CMOS image sensor.

Referring to FIG. 1, the CMOS image sensor includes a photodiode PD, a transfer transistor TT, a reset transistor TR, a selection transistor TS and an access transistor TA. The transfer transistor TT and the reset transistor TR are connected in serial with the photodiode PD. An applied voltage Vdd is supplied to a drain of the reset transistor TR. A drain of the transfer transistor TT (i.e., a source of the reset transistor TR) corresponds to the floating diffusion layer F/D. The floating diffusion layer F/D is connected to a gate of the selection transistor TS. The selection transistor TS and the access transistor TA are connected in serial and an applied voltage Vdd is supplied to a drain of the selection transistor TS. A gate of the access transistor TA is connected to an input port Pi. A source of the access transistor TA is connected to an output port Po.

In operation, the reset transistor TR is turned on to supply the applied voltage Vdd to the floating diffusion layer F/D and then the reset transistor TR is turned off. Thus, a predetermined voltage is applied to the floating diffusion layer F/D and the gate of the selection transistor TS. As a result, the source of the selection transistor TS reaches a predetermined voltage. This is a reset state.

In the reset state, if light is incident upon the photodiode PD, electron-hole pairs (EHPs) are generated and signal electrons are accumulated in the photodiode PD. Then the transfer transistor TT is turned on. As a result, the accumulated signal electrons are transferred to the floating diffusion layer F/D, which changes the voltage of the floating diffusion layer F/D. Therefore, the gate voltage of the selection transistor TS changes and the voltage applied to the source of the selection transistor TS also varies. Depending on the access signal that is applied to the input port Pi, data is generated at the output port Po. After outputting the data, the image sensor is returned to the reset state. By repeating these steps, image signals can be generated.

Some of the sources/drains of the transistors TT, TR, TS, and TA may include a metal silicide layer formed on surfaces thereof so as to reduce ohmic contact or resistance.

FIG. 2 is a schematic cross-sectional view showing a conventional CMOS image sensor. In the drawings, reference indications "a" and "b" refer to a light receiving region and a CMOS device region, respectively.

Referring to FIG. 2, a device isolation layer 2 is formed in a p-type semiconductor substrate 1 with the light receiving region "a" and the CMOS device region "b" so as to define an active region. The light receiving region "a" is the region where a photodiode PD is formed and the CMOS device region "b" is the region where the CMOS devices are formed. A gate oxide layer 3 and a gate electrode layer 4 are sequentially formed on an entire surface of the semiconductor substrate 1 with the device isolation layer 2. Then the gate electrode layer 4 and the gate oxide layer 3 are successively patterned to form a gate pattern 5. The gate pattern 5 is formed at the CMOS device region "b" and comprises a gate oxide layer 3 and a gate electrode layer 4 that are stacked.

An n-type photodiode 6 is formed at the diode region (i.e., an active region that includes the light receiving region "a"). A P-type photodiode 7 is formed between the n-type photodiode 6 and a top surface of the diode region.

Lightly doped impurity diffusion-layers 8 are formed in the active region on both sides of the gate pattern 5. A spacer layer 9 is formed on an entire surface of the substrate 1 with the lightly doped impurity diffusion layers 8. The spacer layer 9 is selectively and anisotropically etched to form spacers 9a at both sides of the gate pattern 5. The spacer layer 9 is positioned above the photodiodes 6 and 7.

Heavily doped impurity diffusion layers 8a are formed in the active region on the sides of the lightly doped impurity diffusion layers 8. A metal layer 10 is formed on an entire surface of the substrate 1 with the heavily doped impurity diffusion layers 8a. Silicon or polysilicon is reacted with the metal layer 10 to form a metal silicide layer 10a. The metal silicide layer 10a is selectively formed on a surface of the heavily doped impurity diffusion layers 8a. That is, the spacer layer 9 positioned above the photodiodes 6 and 7 prevents the silicide layer 10a from being formed on top of the photodiodes 6 and 7.

During the silicidation process, the metal layer 10 remains on top of the photodiodes 6 and 7. As a result, metal elements of the metal layer 10 penetrate the spacer layer 9 into the photodiodes 6 and 7. These penetrating metal elements may increase dark current of the photodiodes 6 and 7. Dark current means the current that flows from the pixels without light being incident upon the photodiodes 6 and 7. The dark current may increase the occurrence of dark defects that result when pixels operate without light.

SUMMARY OF THE INVENTION

It is a feature of the present invention to provide an image sensor to reduce dark defects and a method of fabricating the same.

It is another feature of the present invention to provide an image sensor to improve color distinction of a picture and a method of fabricating the same.

In accordance with a preferred embodiment of the present invention, an image sensor includes a device isolation layer that is formed in a first conduction type semiconductor substrate to define a diode region and an active region. A second conduction type photodiode is disposed in the diode region. The second conduction type photodiode is a predetermined depth from a top surface of the semiconductor substrate. A first conduction type photodiode is interposed between the second conduction type photodiode and the surface of the semiconductor substrate. A first gate is disposed on the active region adjacent to the second conduction type photodiode. At least one sidewall spacer is disposed on one sidewall of the first gate on the side opposite the diode region. The sidewall spacer has a first spacer which is. L-shaped and a second spacer which is disposed on the first spacer. A blocking pattern and insulation pattern are stacked on the diode region. The blocking pattern is formed of insulation material having a metal diffusion coefficient which is lower than a silicon oxide diffusion coefficient.

In accordance with another embodiment, an image sensor includes device isolation layer that is formed in a first conduction type semiconductor substrate to define a diode region and an active region. A second conduction type photodiode is disposed in the diode region. The second conduction type photodiode is a predetermined depth from a top surface of the semiconductor substrate. A first conduction type photodiode is interposed between the second conduction type photodiode and the surface of the semiconductor substrate. A first gate is disposed on the active region adjacent to the second conduction type photodiode. A floating diffusion layer is disposed in the active region adjacent to the first gate on the side opposite the diode region. A silicide preventing pattern covers the diode region, the first gate and the floating diffusion layer. A color ratio control layer is disposed on the silicide preventing pattern.

In accordance with yet another embodiment, an image sensor includes a device isolation layer that is formed in a first conduction type semiconductor substrate to define a diode region and an active region. A second conduction type photodiode is formed in the diode region, wherein the second conduction type photodiode is a predetermined depth from a top surface of the semiconductor substrate. A first conduction type photodiode is interposed between the second conduction type photodiode and the surface of the semiconductor substrate. A first gate is disposed on the active region adjacent to the second conduction type photodiode. A floating diffusion layer is disposed in the active region adjacent to the first gate and on the side opposite the diode region. A blocking pattern is disposed on the diode region. The blocking pattern is formed of insulation material having a metal diffusion coefficient which is lower than a silicon oxide diffusion coefficient. A silicide preventing pattern covers the diode region, the first gate and the floating diffusion layer. A color ratio control layer is disposed on the silicide preventing pattern.

In accordance with still another embodiment, a method of fabricating an image sensor is provided. A device isolation layer is formed in a first conduction type semiconductor substrate to define a diode region and an active region. A second conduction type photodiode and a first conduction type photodiode are formed. The second conduction type photodiode is a predetermined depth from a surface of the diode region, and the first conduction type photodiode is disposed between the surface of the diode region and the second conduction type photodiode. A first gate is formed on the active region adjacent to the diode region. A blocking pattern, spacer insulation pattern and at least one sidewall spacer are formed. The blocking pattern and the spacer insulation pattern are sequentially formed on the diode region, and the sidewall spacer is formed on one sidewall of the first gate and on the side opposite the diode region. The sidewall spacer may include a first spacer which is L-shaped and a second spacer which is disposed on the first spacer. The blocking pattern is formed of a material having a metal diffusion coefficient which is lower than a silicon oxide diffusion coefficient.

In accordance with further another embodiment, a method of fabricating an image sensor is provided. A device isolation layer is formed in a first conduction type semiconductor substrate to define a diode region and an active region. A second conduction type photodiode and a first conduction type photodiode are formed. The second conduction type photodiode is a predetermined depth from a surface of the diode region, and the first conduction type photodiode is disposed between the surface of the diode region and the second conduction type photodiode. A first gate is formed on the active region adjacent to the diode region. A floating diffusion layer is formed in the active region adjacent to the first gate on the side opposite the diode region. A silicide preventing pattern is formed to cover the diode region, the first gate and the floating diffusion layer. A color ratio control layer is formed on the semiconductor substrate having the silicide preventing pattern.

In accordance with a still further embodiment, a method of fabricating an image sensor is provided. A device isolation layer is formed in a first conduction type semiconductor substrate to define a diode region and an active region. A second conduction type photodiode and a first conduction type photodiode are formed. The second conduction type photodiode is a predetermined depth from a surface of the diode region, and the first conduction type photodiode is disposed between the surface of the diode region and the second conduction type photodiode. A first gate is formed on the active region adjacent to the diode region. A floating diffusion layer is formed in the active region adjacent to the first gate on the side opposite the diode region. A blocking pattern is formed on the diode region. The blocking pattern is formed of insulation material having a metal diffusion coefficient which is lower than a silicon oxide diffusion coefficient. A silicide preventing pattern is formed to cover the blocking pattern, the first gate and the floating diffusion layer. A color ratio control layer is formed on the semiconductor substrate having the silicide preventing pattern.

BRIEF DESCRIPTION OF THE DRAWINGS

Preferred embodiments of the invention can be understood in more detail from the following descriptions taken in conjunction with the accompanying drawings in which:

FIG. 2 is a schematic cross-sectional view of a conventional CMOS image sensor;

DETAILED DESCRIPTION OF THE PREFERRED EMBODIMENTS

Figure 1:
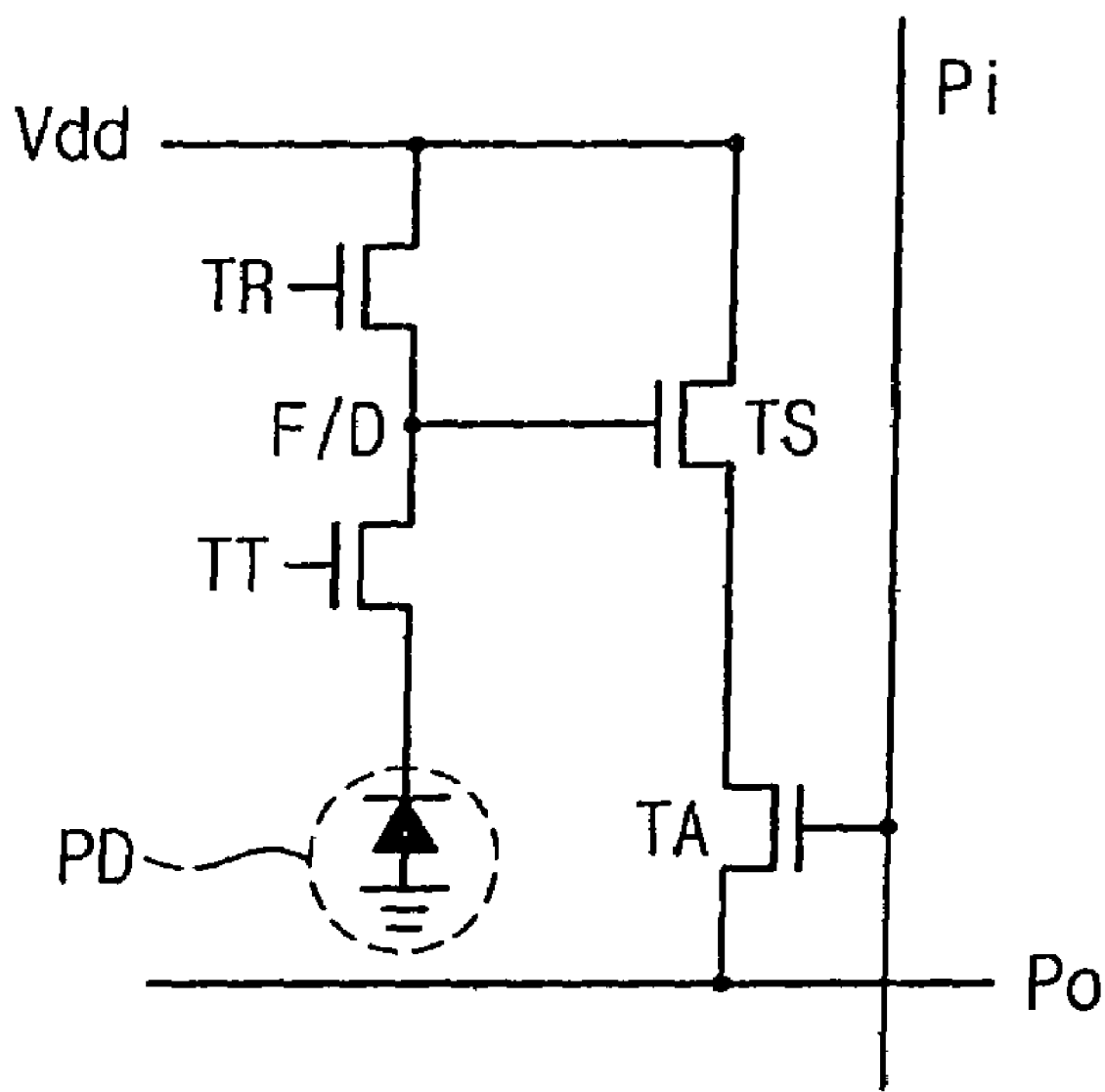
FIG. 1 is an equivalent circuit view of a pixel of a typical CMOS image sensor.

Preferred embodiments of the present invention will be described below in more detail with reference to the accompanying drawings. This invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

Figure 3:
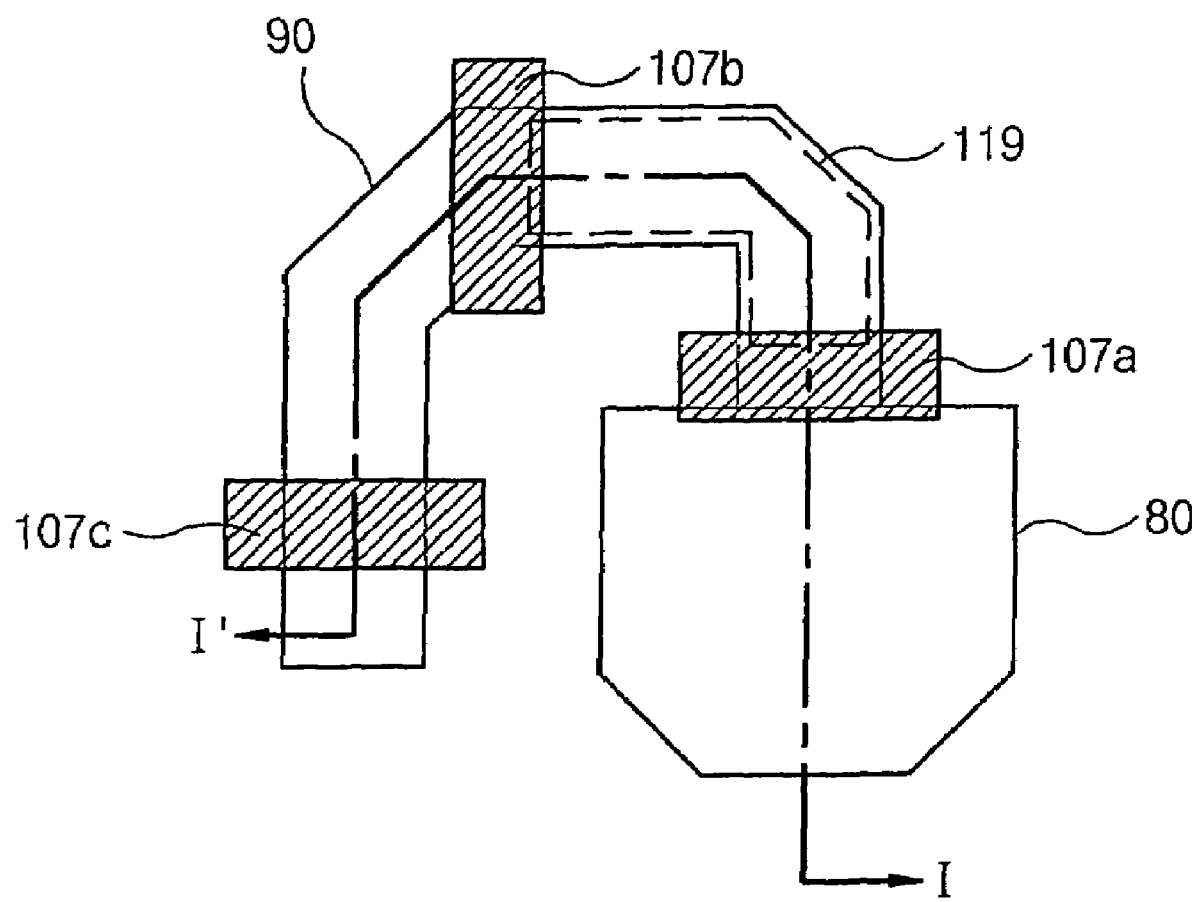
FIG. 3 is a top plane view of an image sensor in accordance with a preferred embodiment of the present invention.
Figure 4:
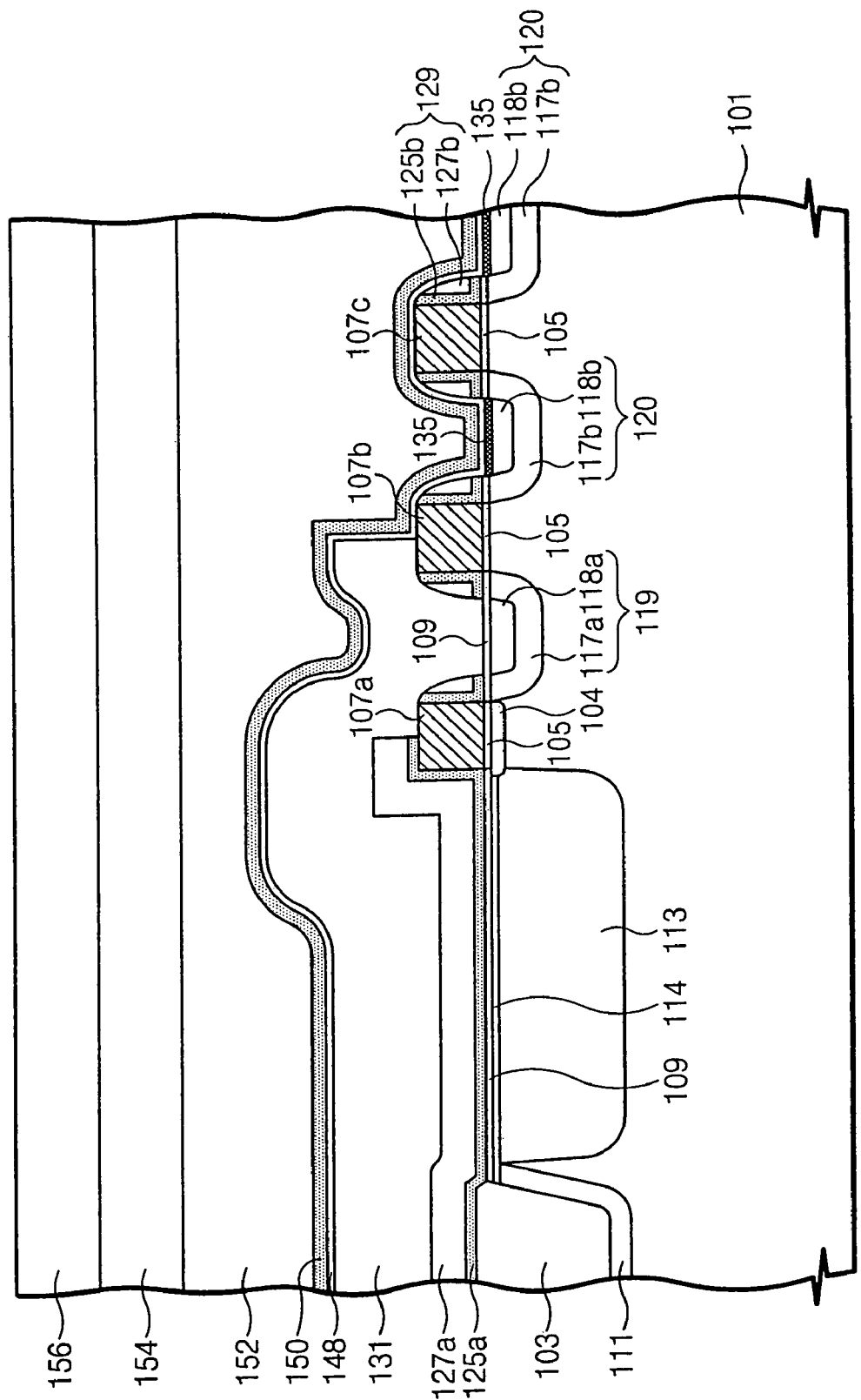
FIG. 4 is a cross-sectional view of the image sensor taken along a line I-I' of FIG. 3.
Figure 5:
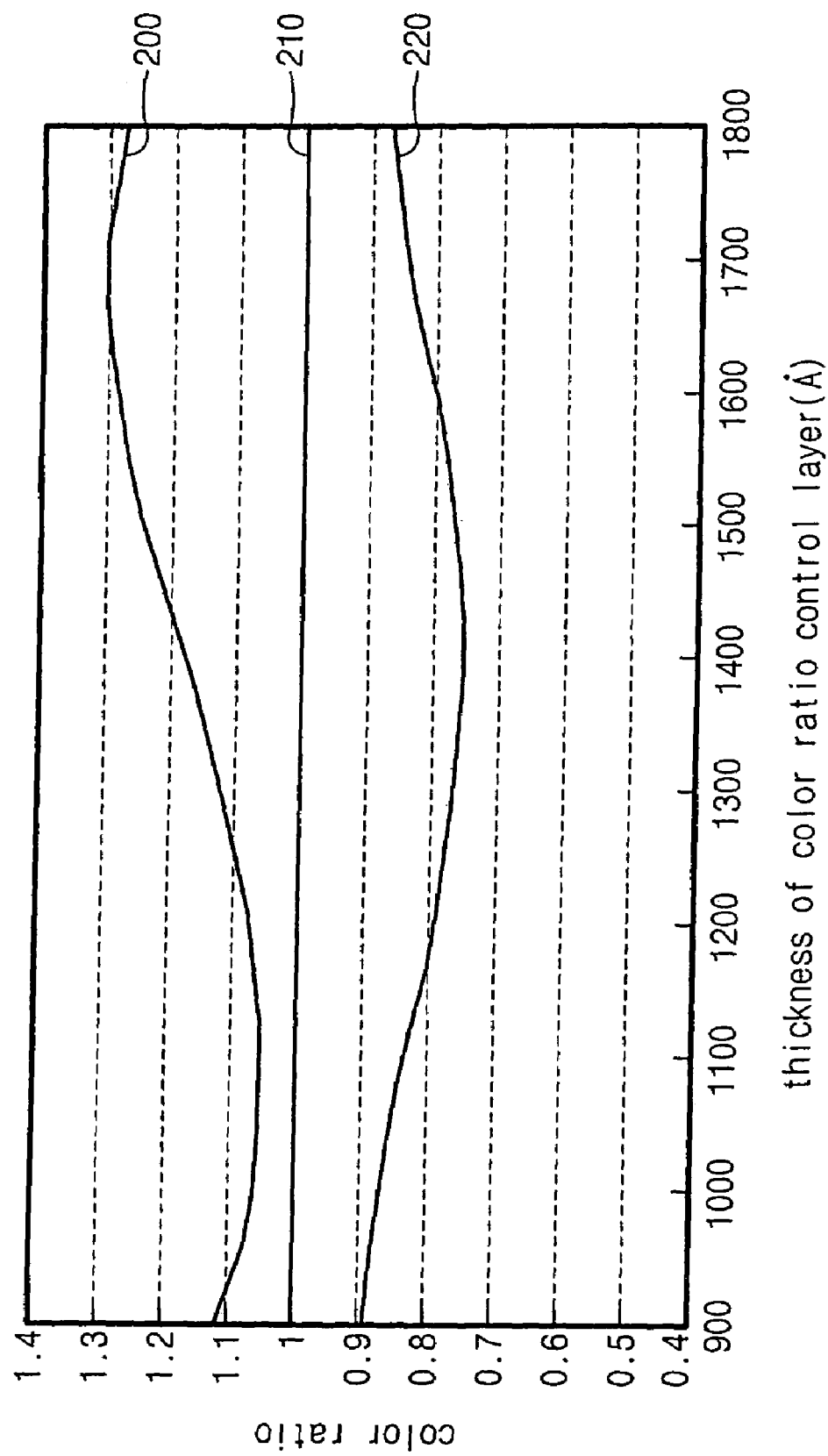
FIG. 5 is a simulation graph showing color ratio according to a thickness of the color ratio control layer of the image sensor of FIG. 4.

FIG. 3 is a top plane view of an image sensor in accordance with a preferred embodiment of the present invention. FIG. 4 is a cross-sectional view of the image sensor taken along a line I-I' of FIG. 3. FIG. 5 is a simulation graph showing color ratio according to a thickness of the color ratio control layer of the image sensor of FIG. 4.

Referring to FIGS. 3 and 4, the image sensor of the present invention comprises a first conduction type semiconductor substrate 101. A device isolation layer 103 is disposed in a predetermined region of the semiconductor substrate 101 to define a diode region 80 and an active region 90. The diode region 80 is the region where photodiodes are formed. The active region 90 is in contact with one side of the diode region 80. First, second, and third gates 107a, 107b, and 107c are sequentially disposed on the active region 90 and are separated from one another by a predetermined distance. The first, second, and third gates 107a, 107b, and 107c correspond to gates of a transfer transistor TT, a reset transistor TR, and a selection gate TS, respectively. The first gate 107a is disposed on the part of the active region 90 that is next to the diode region 80. A fourth gate (not shown) may be disposed on the active region 90 and separated from the third gate 107c by a predetermined distance. The fourth gate corresponds to a gate of the access transistor TA of FIG. 1. A gate insulation layer 105 is interposed between the gates 107a, 107b and 107c, and the semiconductor substrate 101, respectively.

A second conduction type photodiode 113 is disposed in the diode region 80. The second conduction type photodiode 113 is at a predetermined depth from the surface of the semiconductor substrate 101. A first conduction type photodiode 114 is disposed between the second conduction type photodiode 113 and the surface of the semiconductor substrate 101. One side of the first conduction type photodiode 114 is in contact with the semiconductor substrate 101. A first conduction type well 111 may be further disposed so that it surrounds the device isolation layer 103. One side of the photodiode 114 may be extended to contact the first conduction type well 111. Therefore, the first conduction type photodiode 114 contacts the semiconductor substrate 101 via the first conduction type well 111. The first conduction type may be p-type and the second conduction type may be n-type. Alternatively, the second conduction type may be p-type and the first conduction type is n-type.

The second conduction type photodiode 113 and the first conduction type semiconductor substrate 101 form a PN junction, and a depletion region is formed as a result of the formation of the PN junction. Light incident upon the depletion region causes electron-hole pairs (EHPs) to form at the depletion region. Therefore, signal electrons are accumulated in the second conduction type photodiode 113.

The first conduction type photodiode 114 suppresses dark current resulting from dangling bonds that are distributed on the surface of the semiconductor substrate 101. EHPs that are generated by dangling bonds may cause dark current. In this case, the first conduction type photodiode 114 ejects electrons or holes to the semiconductor substrate 101 and eliminates the remaining electrons or holes by recombination. For example, if the first conduction type is p-type and the second conduction type is n-type, the electrons generated by the dangling bonds are recombined with the holes of the p-type photodiode 114 and the holes generated by the dangling bonds are ejected to the semiconductor substrate 101 via the p-type well 111. In addition, the first conduction type photodiode 114 forms PN junction with the second conduction type photodiode 113 to build a depletion region. Therefore, the depletion region of the diode region 80 increases, such that the image sensor can have improved capacity.

A floating diffusion layer 119 is disposed in the active region 90 between the first and second gates 107a and 107b. The floating diffusion layer 119 may comprise a first lightly doped diffusion layer 117a and a first heavily doped diffusion layer 118a. The floating diffusion layer 119 may be formed with a double doped drain structure (DDD structure) in which the first lightly doped diffusion layer 117a surrounds the first heavily doped diffusion layer 118a, or formed with a lightly doped drain structure (LDD structure). Alternatively, the floating diffusion layer 119 may be formed of only the first lightly doped diffusion layer 117a without the first heavily doped diffusion layer 118a. An impurity diffusion layer 120 is disposed in active region 90 on both sides of the third gate 107c. The impurity diffusion layer 120 may be formed of a second lightly doped diffusion layer 117b and a second heavily doped diffusion layer 118b. The impurity diffusion layer 120 may be formed with the DDD structure or LDD structure. Meanwhile, the impurity diffusion layer 120 may be formed of only the second lightly doped diffusion layer 117b without the second heavily doped diffusion layer 118b. The floating diffusion layer 119 and the impurity diffusion layer 120 are doped with second conduction type impurities and may be doped with identical concentrations of the impurities. A channel diffusion layer 104 may be disposed at a surface (e.g., a first gate channel region) of the active region 90 between the floating diffusion layer 119 and the second conduction type photodiode 113. The channel diffusion layer 104 may be doped with second conduction type impurities that are identical to those of the second conduction type photodiode 113 and the floating diffusion layer 119. The channel diffusion layer 104 can be omitted from the design of the image sensor. The floating diffusion layer 119 and the third gate 107c are electrically connected by interconnection (not shown).

A blocking pattern 125a is disposed on the photodiodes 113 and 114. The blocking pattern 125a is an insulation layer having a metal diffusion coefficient which is lower than a silicon oxide diffusion coefficient. For example, the blocking pattern 125a is preferably formed of silicon nitride. The blocking pattern 125a protects the photodiodes 113 and 114 from contamination by metal elements that may occur while the metal silicide layer 135 is formed. Thus, conventional dark defects that result from the contamination by the metal elements can be reduced. The blocking pattern 125a is extended to cover a portion of a top surface of the first gate 107a.

An oxide layer 109 is preferably interposed between the blocking pattern 125a and the semiconductor substrate 101. The oxide layer 109 may serve as a stress buffer layer between the blocking pattern 125a and the semiconductor substrate 101. The oxide layer 109 may be formed of thermal oxide. A spacer insulation pattern 127a may be disposed on the blocking pattern 125a. The spacer insulation pattern 127a may be formed of CVD silicon oxide.

Referring to FIGS. 3 and 4, sidewall spacers 129 are disposed on the sidewall of the first gate 107a next to the floating diffusion layer 119, and on both sidewalls of the second and third gates 107b and 107c. The sidewall spacers 129 may comprise first and second spacers 125b and 127b that are stacked. The first spacer 125b is L-shaped and may be formed of the same material as the blocking pattern 125a. The second spacer 127b may be shaped like a spacer known to one of ordinary skill in the art and may be formed of the same material as the spacer insulation pattern 127a.

A silicide preventing pattern 131 may be disposed to cover the spacer insulation pattern 127a, the blocking pattern 125a, the first gate 107a, and the floating diffusion layer 119. The silicide preventing pattern 131 may be formed of CVD silicon oxide. A metal silicide layer 135 is disposed on a surface of the impurity diffusion layer 120. The metal silicide layer 135 may be formed of cobalt silicide, nickel silicide, or titanium silicide. The silicide preventing pattern 131 prevents the formation of the metal silicide layer 135 on a surface of the floating diffusion layer 119. Therefore, the surface of the floating diffusion layer 119 cannot be contaminated. The oxide layer 109 may be interposed between the silicide preventing pattern 131 and the floating diffusion layer 119.

A buffer insulation layer 148 and a color-ratio control layer 150, which may be stacked, are disposed on the silicide preventing pattern 131. The buffer insulation layer 148 and the color-ratio control layer 150 are extended to cover the second and third gates 107b and 107c, the sidewall spacers 129, and the metal silicide layer 135. The color-ratio control layer 150 is an insulation layer that is capable of controlling color ratio, i.e., the ratio of sensitivities to blue, green and red colors (the three primary colors of the colored light that is incident on the image sensor). The sensitivity to the colors means a degree of reaction of the image sensor with respect to intensity of the incident colors. The color ratio control layer 150 is preferably formed of silicon nitride. The buffer insulation layer 148 may be formed of CVD silicon oxide. The buffer insulation layer 148 may absorb the stress between the color ratio control layer 150 and the metal silicide layer 135.

In the image sensor, a method of characterizing colors of the subject uses an additive color mixture among the three primary colors of the colored light. That is to say, predetermined filters (not shown) are disposed over upper parts of a plurality of the pixels including the photodiodes 113 and 114, respectively. The filters are classified into blue, green, and red filters. The blue filter polarizes the blue light of the incident light, the green filter polarizes the green light of the incident light, and the red filter polarizes the red light of the incident light. The pixel having the blue filter, the pixel having the green filter, and the pixel having the red filter are respectively disposed next to each other. Therefore, depending on the intensity of the polarized colors, the pixels generate electrical signals and the electrical signals are transferred to a display means (not shown). The display means regenerates the colors from the transferred electrical signals and additively mixes the regenerated colors to display a picture.

The color ratios that are controlled by the color ratio control layer 150 are preferably a blue/green color ratio and a red/green color ratio.

According to a thickness of the color-ratio control layer 150, the color ratio may be varied. This is explained with reference to FIG. 5. Data of FIG. 5 are simulation data.

Referring to FIGS. 4 and 5, the X-axis of the graph of FIG. 5 indicates a thickness of the color ratio control layer 150 and the Y-axis indicates a color ratio. A curve 200 shows a red/green color ratio depending on the thickness of the color ratio control layer. 150. A curve 220 shows a blue/green color ratio depending on the thickness of the color ratio control layer 150. A curve 210 shows a green/green color ratio depending on the thickness of the color ratio control layer 150 and has a value of "1" with respect to all the thicknesses of the color ratio control layer 150. The curves 200 and 220 vary with respect to the thickness of the color ratio control layer 150. In the preferred embodiment, the color ratio control layer 150 is formed to a thickness in which a difference of color ratio between the red/green and blue/green color ratios is minimized. That is, the differences between the pixel sensitivities with respect to the incident blue and the incident red light are reduced, thereby improving color distinction of the picture embodied by the image sensor. In the graph of FIG. 5, if the color ratio control layer 150 has a thickness of 1000 Å, a difference between the curves 200 and 220 is minimized. The data of FIG. 5 are simulation data, such that the thickness applied to the practical image sensor can be changed.

Referring to FIGS. 3 and 4, at least one of interlayer insulation layers 152 and 154 is stacked on the color ratio control layer 150. Respective first and second interlayer insulation layers 152 and 154 are illustrated in FIG. 4. An interconnection (not shown) may be disposed between the first and second interlayer insulation layers 152 and 154. The interconnection electrically connects the floating diffusion layer 119 and the third gate 107c. A passivation layer 156 is disposed on the second interlayer insulation layer 154. The passivation layer 156 is an insulation layer that protects the image sensor from contaminators such as moisture. The passivation layer 156 may be formed of silicon nitride.

In the above image sensor, dark defects of the image sensor are reduced by the blocking pattern 125a. The reduced dark defects of the image sensor are explained with reference to FIG. 6.

Figure 6:
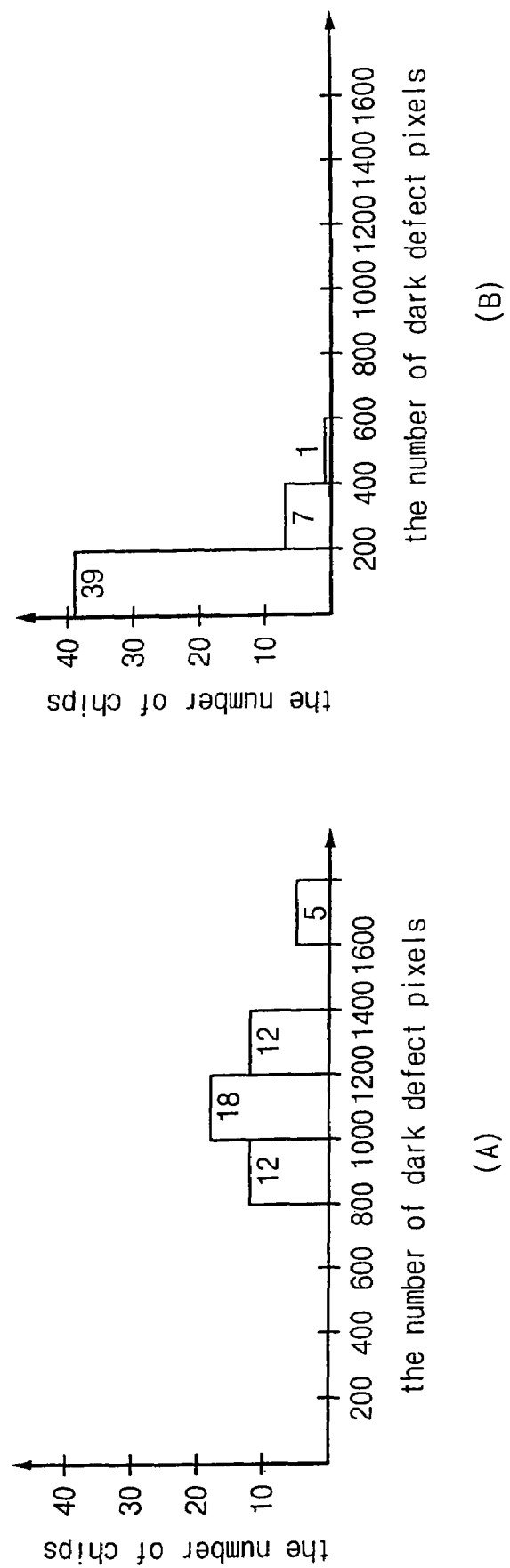
FIG. 6 is a graph showing dark defect characteristics of the image sensor of FIG. 4.

FIG. 6 is a graph showing the dark defect characteristics of the image sensor of FIG. 4. The X-axis refers to the number of dark defect pixels and the Y-axis refers to the number of chips of the image sensor.

Referring to FIG. 6, graph A shows the number of dark defect pixels of the conventional image sensor and graph B shows the number of dark defect pixels of the image sensor of FIG. 4. The total number of chips for both the conventional image sensor and the image sensor of the present invention are 47. The dark defect pixels are the pixels that generate signal electrons at a rate greater than 5 mV/sec without incident light. The number of pixels per conventional chip and the number of pixels per chip according to the present invention are equally 300,000.

As illustrated in the graph A, all 47 of the conventional chips have more than 800 dark defect pixels. There are 18 chips which have 1000-1200 dark defect pixels. In contrast, as illustrated in the graph B, all 47 chips of the present invention have less than 600 dark defect pixels and 39 chips only have 0-200 dark defect pixels.

As a result, according to the image sensor of the present invention, the photodiodes 113 and 114 are prevented from conventional contamination by metal elements by the blocking pattern 125a of FIG. 4.

Color ratio characteristics of the image sensor are explained with reference to FIG. 7.

Figure 7:
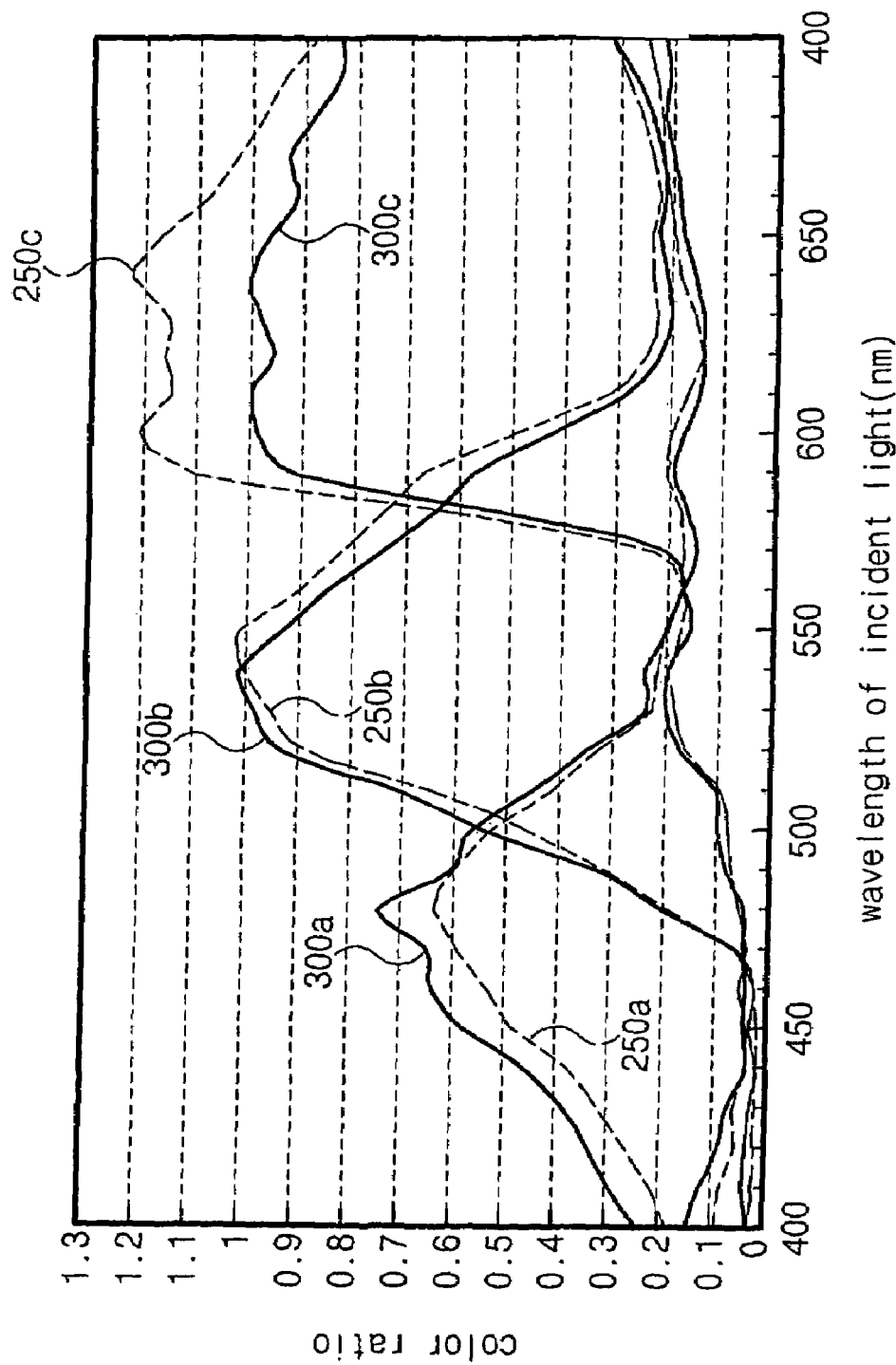
FIG. 7 is a graph showing color ratio characteristics of the image sensor of FIG. 4.

FIG. 7 is a graph showing color ratio characteristics of the image sensor of FIG. 4. The X-axis indicates wavelength of the incident light and the Y-axis indicates color ratio.

Referring to FIGS. 4 and 7, curves 250a, 250b, and 250c represent a first pixel including a blue filter, a first pixel including a green filter, and a first pixel including a red filter, respectively. The curves 300a, 300b, and 300c represent a second pixel including a blue filter, a second pixel including a green filter, and a second pixel including a red filter, respectively. The first pixels include a thermal oxide layer 109 with a thickness of 100 Å, a spacer insulation pattern 127a with a thickness of 400 Å, a spacer insulation pattern 127a with a thickness of 1300 Å, and a silicide preventing pattern 131 with a thickness of 1000 Å, and do not include a color ratio control layer 150. The second pixels include a thermal oxide layer 109 with a thickness of 100 Å, a blocking pattern with a thickness of 400 Å, a spacer insulation pattern 127a with a thickness of 1300 Å, a silicide preventing pattern 131 with a thickness of 1000 Å, and a color ratio control layer 150 with a thickness of 1000 Å.

As illustrated in FIG. 7, a maximum blue/green color ratio of the first pixel is about 0.62 at a wavelength of 480 nm of the incident light and a maximum red/green color ratio of the first pixel is about 1.21 at a wavelength of 640 nm of the incident light. Meanwhile, a maximum blue/green color ratio of the second pixel is about 0.73 at a wavelength of 480 nm of the incident light and a maximum red/green color ratio of the second pixel is about 1 at a wavelength of 640 nm of the incident light. That is, the color ratio control layer 150 increases the blue/green color ratio and decreases the red/green color ratio, such that the difference between the blue/green and red/green color ratio is minimized. As a result, the image sensor with the second pixel including the color ratio control layer 150 improves the color distinction of the picture.

Accordingly, the photodiodes 113 and 114 can be prevented from contamination by the metal elements by the blocking pattern 125a in the image sensor. Therefore, dark defects can be reduced that result from contamination by the conventional metal elements. In addition, the image sensor includes the color ratio control layer 150, thereby improving the color distinction of the picture.

FIGS. 8-11 are cross-sectional views of the image sensor of FIG. 4 for reference in explaining a method of fabricating the image sensor of FIG. 4.

Figure 8:
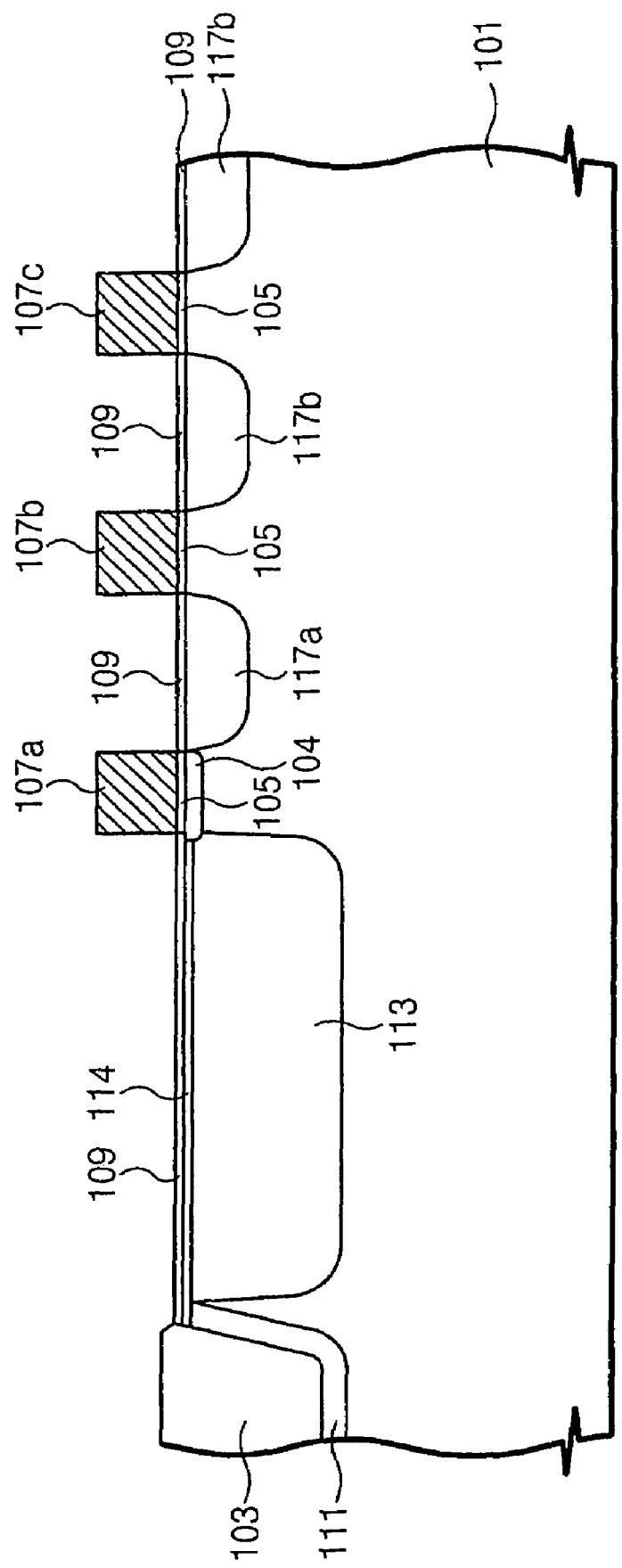
FIGS. 8-11 are cross-sectional views of the image sensor of FIG. 4 for use in explaining a method of fabricating same in accordance with a preferred embodiment of the present invention.

Referring to FIGS. 3 and 8, a device isolation layer 103 is formed in a predetermined region of a first conduction type semiconductor substrate 101 to define a diode region 80 and an active region 90. The active region 90 contacts one side of the diode region 80. Impurity ions are selectively implanted into the semiconductor substrate 101 with the device isolation layer 103 to form a first conduction type well 111 that surrounds the device isolation layer 103. In this case, a well (not shown) also may be formed in the active region 90.

A second conduction type photodiode 113 and a first conduction type photodiode 114 are formed in the diode region 80. The second conduction type photodiode 113 is a predetermined depth from a surface of the semiconductor substrate 101, and the first conduction type photodiode 114 is interposed between the second conduction type photodiode 113 and a surface of the semiconductor substrate 101.

The first conduction type photodiode 114 may be formed to contact one side of the first conduction type well 111. A channel diffusion layer 104 is formed in the active region 90 next to the diode region 80. A gate insulation layer 105 and a gate layer (not shown) are sequentially formed on an entire surface of the semiconductor substrate 101 with the channel diffusion layer 104, and then the gate layer and the gate insulation layer 105 are successively patterned to form first, second, and third gates 107a, 107b and 107c in the active region 90. The gates 107a, 107b and 107c are separated from one another by a predetermined distance. The first gate 107a is formed on the channel diffusion layer 104. A first lightly doped diffusion layer 117a is formed in the active region 90 between the first and second gates 107a and 107b, and a second lightly doped diffusion layer 117b is formed in the active region 90 adjacent both sides of the third gate 107c.

The photodiodes 113 and 114 and the gates 107a, 107b and 107c are formed according to the following order. First, the photodiodes 113 and 114 are formed and then the gates 107a, 107b, and 107c may be formed. Alternatively, the gates 107a, 107b, and 107c are formed first and then the photodiodes 113 and 114 may be formed.

An oxide layer 109 is formed on a surface of the active region 90 between both sides of the each gate 107a, 107b, and 107c and on a surface of the diode region 80. The oxide layer 109 may be formed of thermal oxide. That is, a thermal oxidation process is applied to the semiconductor substrate 101 and the gates 107a, 107b, and 107c, thereby forming the oxide layer 109. In this case, the thermal oxidation process cures the etch damages of the gates 107a, 107b, and 107c. Therefore, the thermal oxide layer (not shown) may be also formed on surfaces of the gates 107a, 107b, and 107c.

Figure 9:
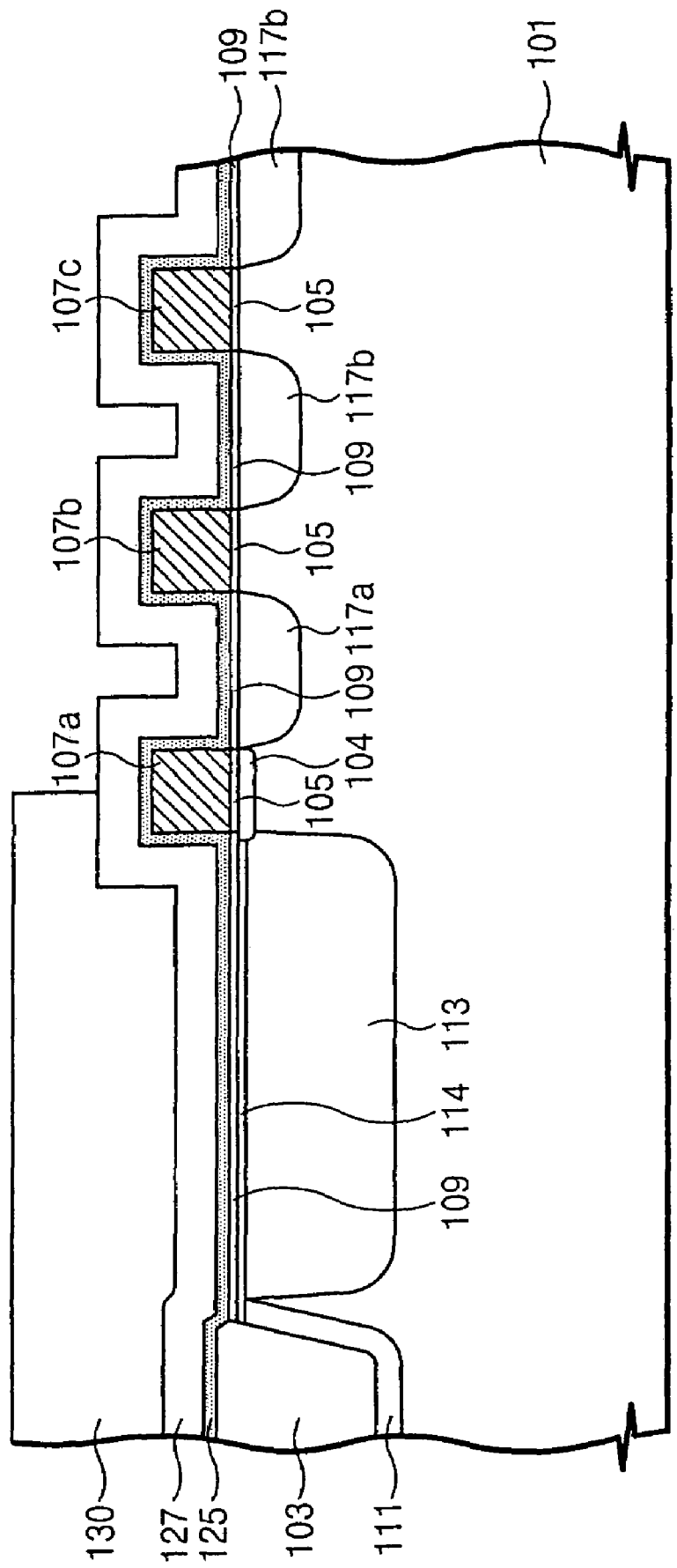
Figure 10:
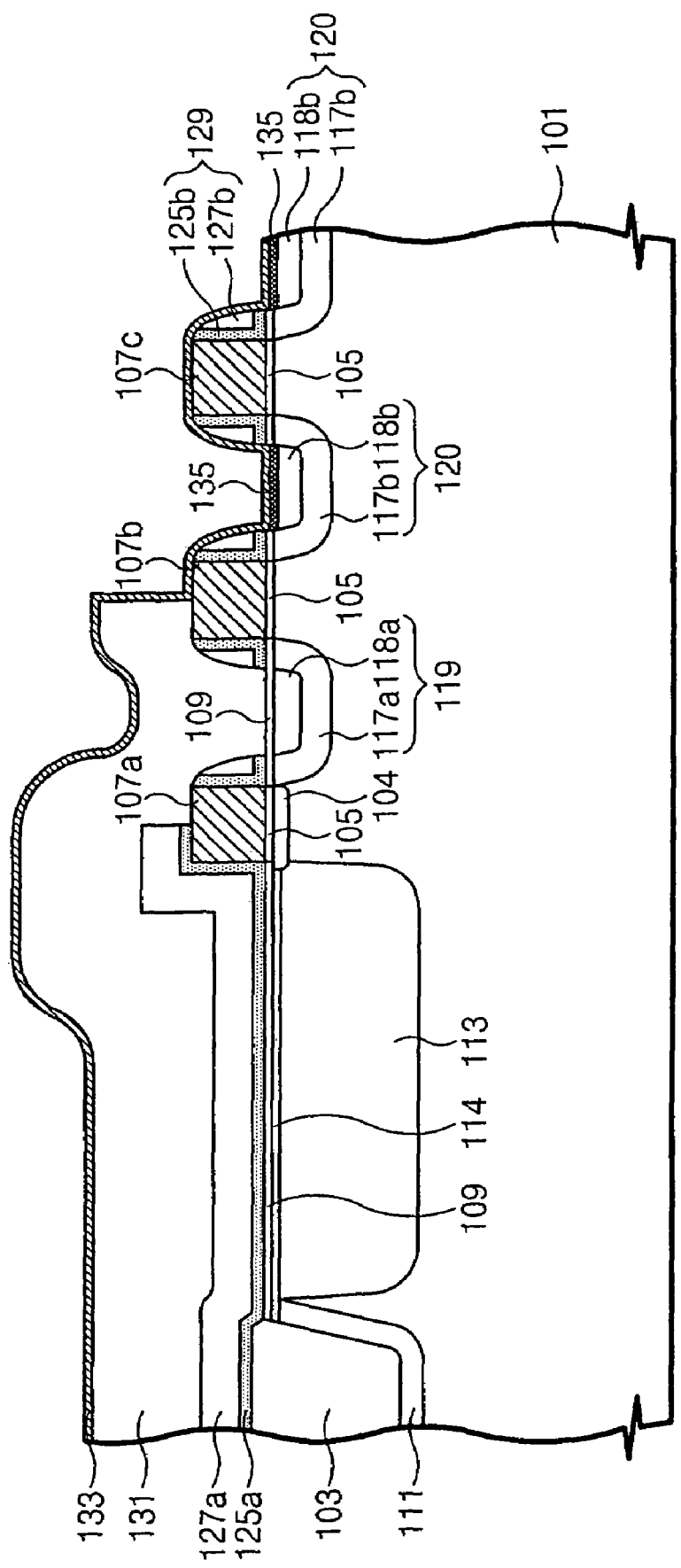

Referring to FIGS. 9 and 10, a blocking layer 125 and a spacer insulation layer 127 are sequentially formed on an entire surface of the substrate 101 with the oxide layer 109, the photodiodes 113 and 114, and the gates 107a, 107b, and 107c. The blocking layer 125 is formed of insulation material having a metal diffusion coefficient which is lower than a silicon oxide diffusion coefficient. For example, the blocking layer 125 is preferably formed of silicon nitride. The spacer insulation layer 127 may be formed of CVD silicon oxide.

A photoresist pattern 130 is formed on the spacer insulation layer 127. The photoresist pattern 130 covers at least the diode region 80 and may cover a portion of the first gate 107a.

Using the photoresist pattern 130 as a mask, the spacer insulation layer 127 and the blocking layer 125 are etched by an anisotropic etching process to form a blocking pattern 125a and a spacer insulation pattern 127a that are sequentially stacked under the photoresist pattern 130, and to form sidewall spacers 129 on one sidewall of the first gate 107a next to the first lightly doped diffusion layer 117a and each of the sidewalls of the second and third gates 107b and 107c. The sidewall spacers 129 may comprise first and second spacers 125b and 127b that are stacked. The first spacer 125b is a portion of the blocking layer 125 and is shaped like an "L". The second spacer 127b is a portion of the spacer insulation layer 127 and is shaped like a spacer known to one of ordinary skill in the art. The thickness of the spacer insulation layer 127 affects a bottom width of the sidewall spacer 129. That is, thickness of the spacer insulation layer 127 may be altered to form sidewall spacers 129 which have a desired bottom width. The spacer insulation layer 127 also may be omitted and the sidewall spacer 129 may be formed with a portion of the blocking layer 125.

The photoresist pattern 130 may be removed by an ashing process.

Using the blocking pattern 125a, the spacer insulation pattern 127a and the sidewall spacer 129 as a mask, impurity ions are implanted to form a first heavily doped diffusion layer 118a and second heavily doped diffusion layers 118b. The first heavily doped diffusion layer 118a is formed in an active region 90 between the first and second gates 107a and 107b. The second heavily doped diffusion layers 118b are formed in an active region 90 adjacent both sides of the third gate 107c. The first lightly and heavily doped diffusion layers 117a and 118a constitute a floating diffusion layer 119 and the second lightly and heavily doped diffusion layers 117b and 118b constitute an impurity diffusion layer 120. The floating diffusion layer 119 and the impurity diffusion layer 120 may be formed with DDD structure or LDD structure. Using another method, the first heavily doped diffusion layer 118a and the second heavily doped diffusion layer 118b may be omitted, such that it is possible that the first lightly doped diffusion layer 117a constitutes the floating diffusion layer 119 and the second lightly doped diffusion layer 117b constitutes the impurity diffusion layer 120.

A silicide preventing layer (not shown) is formed on an entire surface of the semiconductor substrate 101 including the floating diffusion layer 119 and the impurity diffusion layer 120. The silicide preventing layer is patterned to form a silicide preventing pattern 131 to cover the spacer insulation pattern 127a, the first gate 107a and the floating diffusion layer 119. The silicide preventing pattern 131 may be formed of CVD silicon oxide.

A metal layer 133 is formed on an entire surface of the semiconductor substrate 101 including the silicide preventing pattern 131. A metal silicidation process is performed on the semiconductor substrate 101 including the metal layer 133 to form a metal silicide layer 135 on a surface of the impurity diffusion layer 120. The metal layer deposition process and the metal silicidation process may be performed in situ.

During the metal silicidation process, the blocking pattern 125a protects the photodiodes 113 and 114 from contamination from the metal elements due to the metal layer 133 lying on the silicide preventing pattern 131. As a result, the conventional dark defects that result form contamination by the metal elements can be reduced. The silicide preventing pattern 131 prevents the formation of the metal silicide layer 135 on the surface of the floating diffusion layer 119. It is preferred that the metal silicide layer 135 not be formed on top of the floating diffusion layer 119 because this prevents surface defects of the floating diffusion layer 119, thereby improving efficiency of the image sensor.

Figure 11:
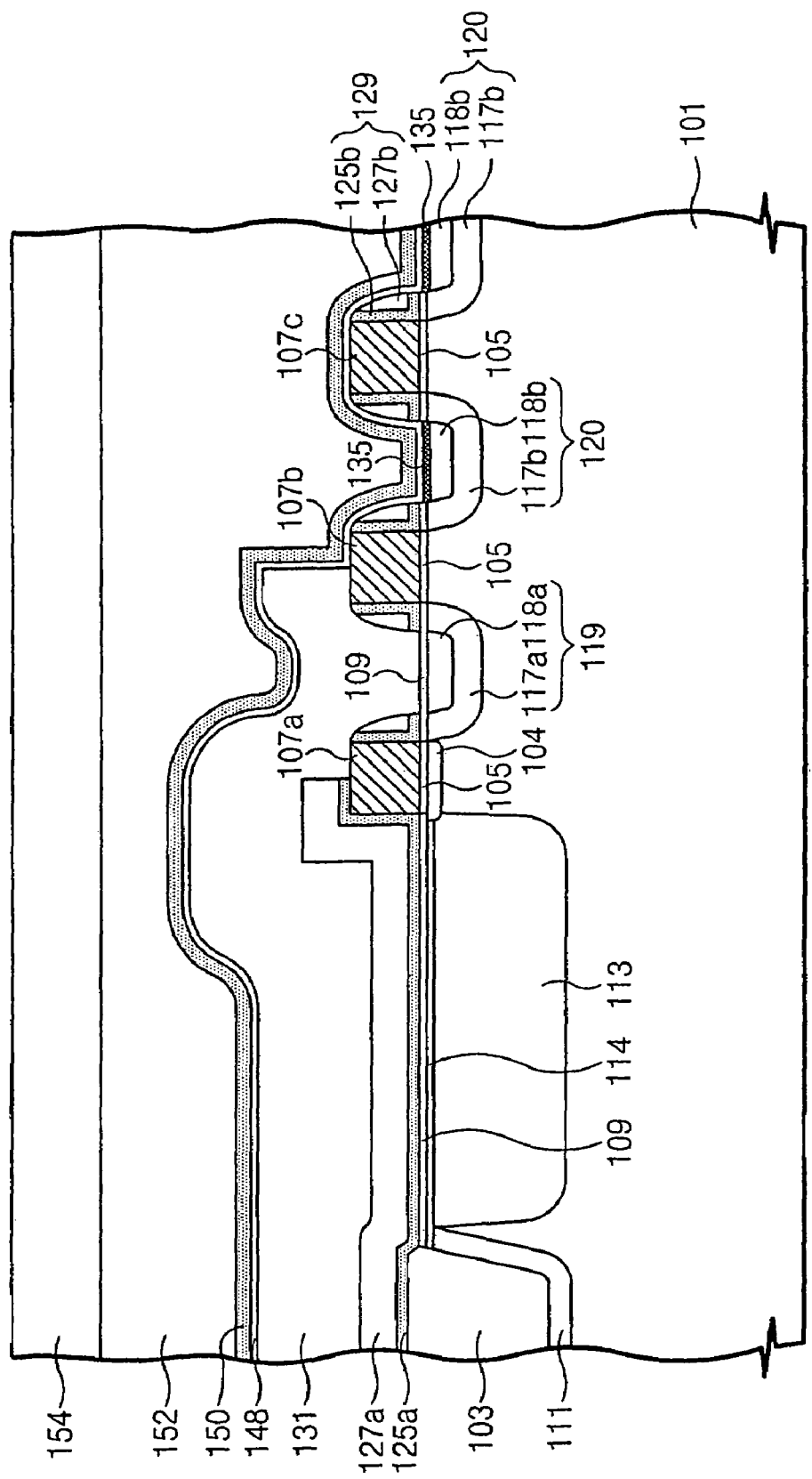

Referring to FIG. 11, the metal layer 133 that is not reacted is omitted. A buffer insulation layer 148 and a color ratio control layer 150 are sequentially formed on an entire surface of the semiconductor substrate 101 with the metal silicide layer 135. The color ratio control layer 150 is formed of an insulation layer such as silicon nitride that can control color ratio. The color ratio is the ratio between the sensitivities to blue, green and red (i.e., the three primary colors of the colored light that is incident on the image sensor). The color ratio control layer 150a is formed to a thickness so as to minimize a difference between the blue/green color ratio and red/green color ratio. The buffer insulation layer 148 may absorb stress between the color ratio control layer 150 and the metal silicide layer 135. The buffer insulation layer 148 also may be omitted.

The color ratio control layer 150 can improve color distinction of the picture embodied by the image sensor.

At least one of the interlayer insulation layers 152 and 154 may be formed on the color ratio control layer 150. First and second interlayer insulation layers 152 and 154 are illustrated in FIG. 11. Before forming the second interlayer insulation layer 154, an interconnection (not shown) may be formed on the first interlayer insulation layer 152, wherein the interconnection electrically connects the floating diffusion layer 119 and the third gate 107c. A portion of the interconnection may penetrate the first interlayer insulation layer 152, the color ratio control layer 150, the buffer insulation layer 148, the silicide preventing pattern 131 and the oxide layer 109 to contact with the floating diffusion layer 119. The other portion of the interconnection may penetrate the first interlayer insulation layer 152, the color ratio control layer 150, and the buffer insulation layer 148 to contact with the third gate 107c.

The passivation layer 156, as shown in FIG. 4, may be formed on the second interlayer insulation layer 154. The passivation layer 156 prevents the image sensor from coming in contact with outer contaminants such as moisture. The passivation layer 156 may be formed of silicon nitride.

According to the present invention, the image sensor includes a blocking pattern disposed on photodiodes. The blocking pattern prevents the photodiodes from contamination from metal elements. Therefore, conventional dark defects that result from contamination by the metal elements can be reduced.

In addition, the image sensor includes a color ratio control layer. The color ratio control layer controls color ratios between the sensitivities to blue, green, and red (i.e., the three primary colors of the colored lights). Especially, the color ratio control layer can reduce a difference between the blue/green color ratio and the red/green color ratio. As a result, color distinction of the picture that is embodied by the image sensor can be improved.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method of forming an image sensor, comprising:
    forming a device isolation layer in a first conduction type semiconductor substrate to define a diode region and an active region;
    forming a second conduction type photodiode at a predetermined depth from a surface of the diode region, and a first conduction type photodiode disposed between the surface of the diode region and the second conduction type photodiode;
    forming a first gate on the active region adjacent to the diode region; and
    forming a blocking pattern and spacer insulation pattern that are stacked on the diode region;
    disposing at least one sidewall spacer on one sidewall of the first gate, wherein the at least one sidewall spacer includes a first spacer and a second spacer disposed on the first spacer;
    forming a floating diffusion layer in the active region adjacent to the first gate;
    forming a silicide preventing pattern covering the blocking pattern, a top surface of the first gate and the floating diffusion layer; and
    forming a metal layer on the semiconductor substrate including the silicide preventing pattern covering the blocking pattern, the top surface of the first gate and the floating diffusion layer.

2. The method of claim 1, further comprising the step of forming an oxide layer on a surface of the semiconductor substrate.

3. The method of claim 1, further comprising the steps of:
    forming a second gate and a third gate that are serially disposed on the active region and separated from the first gate and from each other; and
    forming the at least one sidewall spacer on at least one sidewall of each of the second and third gates.

4. The method of claim 3, further comprising the step of forming a metal silicide layer on a surface of the active region adjacent to at least one sidewall of the third gate.

5. The method of claim 1, wherein the blocking pattern is formed of silicon nitride.

6. The method of claim 1, wherein the blocking pattern is formed of insulation material having a metal diffusion coefficient which is lower than a silicon oxide diffusion coefficient.

* * * * *